United States Patent [19]
Morzano

[11] Patent Number: 5,913,928
[45] Date of Patent: Jun. 22, 1999

[54] DATA COMPRESSION TEST MODE INDEPENDENT OF REDUNDANCY

[75] Inventor: Christopher K. Morzano, Boise, Id.

[73] Assignee: Micron Technology, Inc., Boise, Id.

[21] Appl. No.: 08/853,263

[22] Filed: May 9, 1997

[51] Int. Cl.⁶ .................................................. G11C 29/00
[52] U.S. Cl. .......................... 714/710; 714/711; 714/718; 365/201
[58] Field of Search .................................... 371/10.2, 10.3, 371/21.1, 21.2, 67.1, 71, 25.1; 365/200, 201

[56] References Cited

U.S. PATENT DOCUMENTS

| | | | |
|---|---|---|---|
| 4,389,715 | 6/1983 | Eaton, Jr. et al. | 365/200 |
| 4,532,611 | 7/1985 | Countryman, Jr. | 365/200 |
| 4,639,915 | 1/1987 | Bosse | 371/10 |
| 4,656,609 | 4/1987 | Higuchi et al. | 365/200 |
| 4,745,582 | 5/1988 | Fukushi et al. | 365/200 |
| 4,872,168 | 10/1989 | Aadsen et al. | 371/21.3 |
| 5,155,704 | 10/1992 | Walther et al. | 365/201 |
| 5,185,744 | 2/1993 | Arimoto et al. | 371/21.2 |
| 5,195,099 | 3/1993 | Ueda et al. | 371/40.4 |
| 5,212,442 | 5/1993 | O'Toole et al. | 324/158 R |
| 5,245,577 | 9/1993 | Duesman et al. | 365/201 |
| 5,317,573 | 5/1994 | Bula et al. | 371/10.3 |
| 5,329,488 | 7/1994 | Hashimoto | 365/189.08 |
| 5,416,740 | 5/1995 | Fujita | 365/201 |
| 5,442,641 | 8/1995 | Beranger et al. | 371/21.2 |
| 5,442,642 | 8/1995 | Ingalls et al. | 371/22.5 |
| 5,469,393 | 11/1995 | Thomann | 365/201 |
| 5,475,648 | 12/1995 | Fujiwara | 365/230.06 |
| 5,522,038 | 5/1996 | Lindsay et al. | 395/183.17 |
| 5,523,976 | 6/1996 | Okazawa et al. | 365/200 |
| 5,526,364 | 6/1996 | Roohparvar | 371/22.1 |
| 5,535,161 | 7/1996 | Kato | 365/201 |
| 5,544,108 | 8/1996 | Thomann | 365/201 |
| 5,557,574 | 9/1996 | Senoo et al. | 365/201 |
| 5,568,435 | 10/1996 | Marr | 365/201 |
| 5,602,781 | 2/1997 | Isobe | 365/189.05 |
| 5,617,364 | 4/1997 | Hatakeyama | 365/185.09 |
| 5,644,578 | 7/1997 | Ohsawa | 371/21.2 |
| 5,675,543 | 10/1997 | Rieger | 365/200 |
| 5,777,942 | 7/1998 | Dosaka et al. | 365/230.03 |

*Primary Examiner*—Hoa T. Nguyen
*Attorney, Agent, or Firm*—Schwegman, Lundberg, Woessner & Kluth P.A.

[57] ABSTRACT

A method and circuit for testing cells in a memory device is disclosed. Data is written to the cells and then the cells are read in groups. For example, groups of four cells are read together. Output bits of the four cells are compressed in a compression circuit to generate compressed data, and the compressed data is checked to determine if one or more of the four cells was defective and produced an incorrect output bit. If one of the cells was defective, each cell is read in a sequence and its output bit is tested to determine which of the four cells is defective. The defective cell is replaced with a redundant cell.

21 Claims, 8 Drawing Sheets

DATA COMPRESSION TEST MODE INDEPENDENT OF REDUNDANCY

FIELD OF THE INVENTION

This invention relates generally to memory devices, and more particularly to such memory devices having a data compression test mode.

BACKGROUND OF THE INVENTION

Semiconductor memories such as dynamic random access memories have literally millions of memory storage cells. These storage cells are typically fabricated having individual capacitors as the memory elements and include access transistors. The cells are arranged in rows and columns. A memory cell array refers to these cells as they are organized in rows and columns. To ensure that a particular memory device is fully operational, each of the individual memory cells within the device is operationally tested.

As semiconductor memory technology has evolved, the typical memory device has increasingly stored more and more individual memory cells. This increase in the population of memory cells in a memory device has correspondingly increased the possibility of defects within one or more memory cells and has also increased the time required to test all the cells. Therefore, the need for rapidly testing the cells of a memory device has become even more crucial.

However, because the typical memory device has so many individual memory cells, testing each individual cell can be quite time consuming. A typical testing method writes a test bit to a memory cell, reads an output bit from the memory cell, and compares whether the output bit is identical to the test bit. This last step is the error-checking step. If an error is found—i.e., the output bit is not identical to the test bit—then a redundant memory cell is used to replace the defective cell.

Because this testing method is so time consuming, various solutions have been proposed to decrease testing time. One typical solution is to write a test bit to a predetermined number of memory cells concurrently, reading the output bits of the memory cells, compressing the output bits into a compressed bit, and error checking just the compressed bit. If at least one of the predetermined number of memory cells is defective, the compressed bit will be in error.

This solution is typically called data compression test mode. It is less time consuming in that a number of memory cells are tested at one time, as opposed to each memory cell being tested one at a time. A deficiency to data compression test mode, however, is its inefficient redundancy. If error checking the compressed bit fails, then all of the predetermined number of memory cells are replaced with redundant cells. Thus, if the predetermined number of cells is seven, even if only one of the seven cells is defective, all seven cells are replaced by redundant cells. In other words, the fault-isolation capability of the data compression test mode is severely reduced.

Therefore, for the reasons stated above, and for other reasons stated below which will become apparent to those skilled in the art upon reading and understanding the specification as disclosed herein, there is a need for a data compression test mode that provides more efficient redundancy. That is, there is a need for a data compression test mode that replaces only those memory cells that are defective, instead of all of the predetermined numbered of memory cells tested, and thus which provides for a more accurate fault-isolation technique.

SUMMARY OF THE INVENTION

The above-mentioned problems with memory devices and other problems are addressed by the present invention, which will be understood by reading and studying the following specification. The present invention relates to a data compression test mode, independent of redundancy, for a memory device. A memory device is described which has a data compression test mode that tests at one time a predetermined number of memory cells for defects, but in which only those cells that actually are defective are replaced.

In particular, in one embodiment of the invention, a method for testing a memory array of a memory device includes outputting the output bits of a predetermined number of memory cells, upon failure of the compression mode. The cells may then be checked for errors and replaced if necessary on an individual basis. In this manner, the present invention provides for a data compression test mode independent of redundancy. The memory cells of a memory array are still checked for defects a predetermined number at a time in a compression mode. However, upon the detection of an error within the compression mode, the cells are individually checked for errors to determine which of the cells are actually defective. Only these cells are replaced.

In another embodiment, a memory device includes an array of memory cells, and a compression test mode circuit such that only the cells that are defective are replaced with redundant cells. That is, the circuit checks a number of memory cells at one time in a compression mode, but outputs individually the output bits of the cells upon failure of the compression mode. Still other and further aspects, advantages and embodiments of the present invention will become apparent in the following description and by reference to the accompanying drawings.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
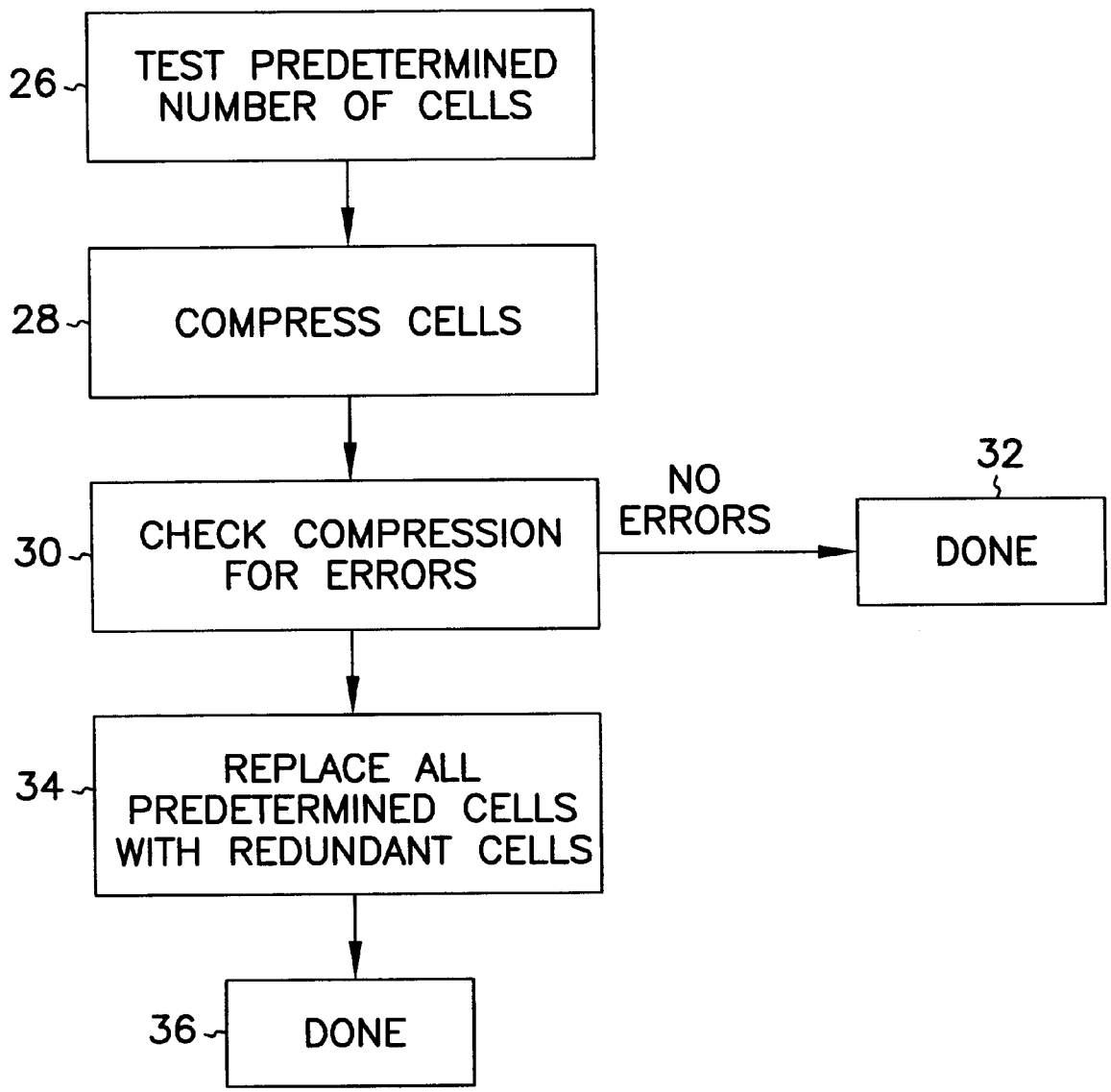
FIG. 1 is a method illustrating a data compression test mode according to the prior art.

A prior art data compression test mode is illustrated in FIG. 1. In step 26, a predetermined number of memory cells are tested. This is typically a simple read-write test conducted on each of the predetermined number of memory cells. That is, a test bit of a logic one or zero is written to each of the predetermined number of cells. Then, each memory cell is read to determine if the memory cell properly stored the test bit. That is, an output bit is read from each memory cell.

In step 28, all of the output bits of the predetermined number of memory cells are compressed into a single compressed bit, so that only the compressed bit must be error-checked, as opposed to individually checking each output bit. This gives the prior art data compression test mode the advantage of quicker testing of a memory device. Thus, in step 30, the compressed bit is error-checked to determine if any of the predetermined memory cells is defective.

For example, a test bit of logic one may be written to each of the predetermined number of cells, and an output bit for each cell then read, in step 26. If each of the cells is functioning properly, the output bit for each is also logic one. However, the output bit for any malfunctioning cell is logic zero. In step 28, the output bits are compressed into a compressed bit. If all the output bits are logic one, they are compressed into a compressed bit also of logic one, whereas if any of the output bits are logic zero, the compressed bit is also logic zero. Thus, in step 30, the compressed bit fails the error-checking if it is logic zero, but not if it is logic one.

If there is no error found in step 30, the process stops at step 32 as to that predetermined number of memory cells. However, if an error is found, then control proceeds to step 34. In step 34, each of the predetermined number of memory cells is replaced by a redundant element. Thus, even if one of the memory cells is defective, in step 34 the prior art data compression test mode replaces all of the predetermined number of memory cells, even those that are nondefective. This means that redundancy is very inefficient. The process stops at step 36.

Figure 2A:
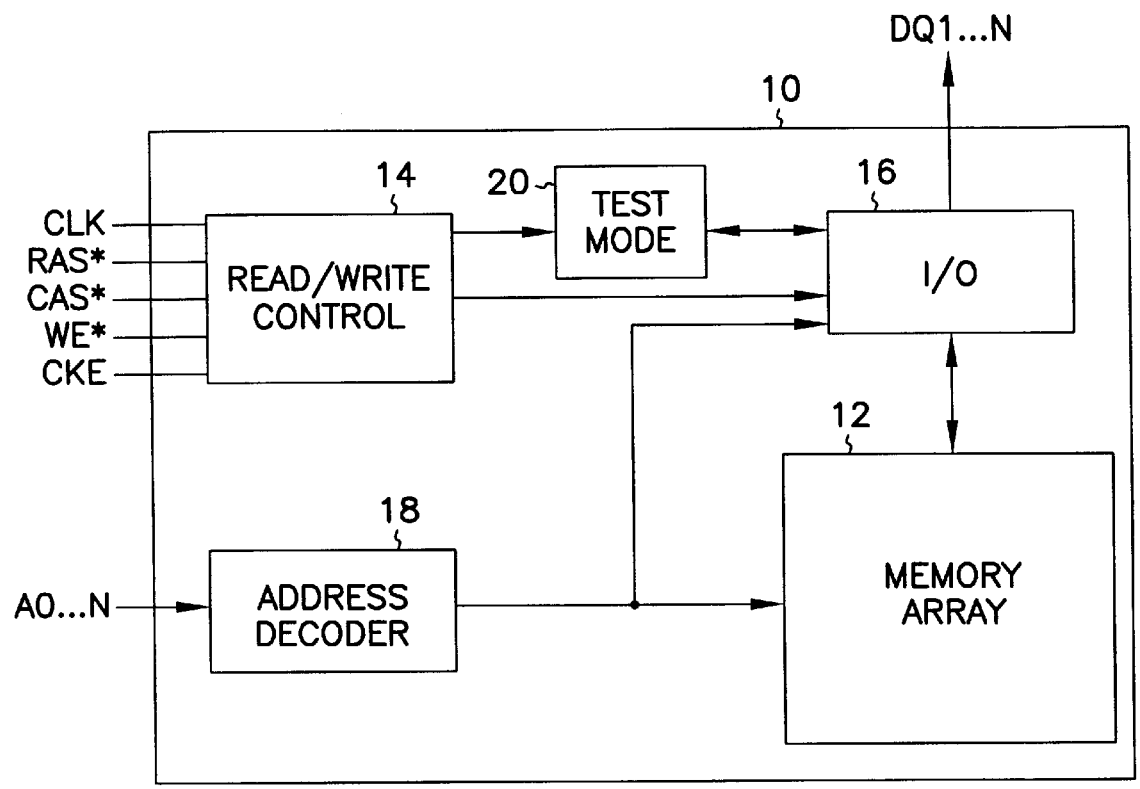
FIG. 2(a) is a block diagram of a typical memory device in conjunction with which an embodiment of the invention may be implemented.

The present invention provides for a data compression test mode independent of redundancy. A typical memory device in conjunction with which an embodiment of the invention is implemented is shown in FIG. 2(a). Memory device 10 includes memory array 12, control circuit 14, input/output buffers 16, address decoder 18 and compression test mode circuit 20. Memory array 12 includes a plurality of memory cells organized into rows and columns. The memory cells are accessed in response to an address signal provided on the address lines A0 . . . AN running to address decoder 18, which includes both row and column decoder circuitry. Input/output buffers 16 are provided for bi-directional communication via the data communications lines DQ1 . . . DQN running out of buffers 16. Control circuit 14 regulates the memory device operations in response to controls signals including, but not limited to, a Clock (CLK), a Row Access Strobe (RAS*), a Column Access Strobe (CAS*), a Write Enable (WE*), and a Clock Enable (CKE). Compression test mode circuit 20 tests the memory cells within memory array 12, and replaces defective cells with redundant cells.

Figure 2B:
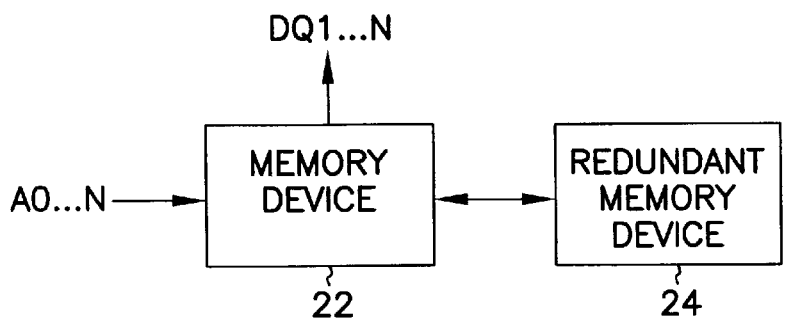
FIG. 2(b) is a block diagram showing a typical configuration of two memory devices in conjunction with which an embodiment of the invention may be implemented.

The redundant memory cells may be a part of the memory device itself—i.e., within memory array 12 of memory device 10, or may be external to the memory device. This latter situation is illustrated in FIG. 2(b). As those skilled in the art will appreciate, memory devices 22 and 24 are coupled to one another such that memory device 24 provides redundant memory cells to memory device 22. Therefore, upon the compression test mode circuit of memory device 22 finding a defective memory cell within the array of cells of memory device 22, it replaces the defective cell with a redundant cell within memory device 24. Those skilled in the art will also appreciate that the present invention is not limited to any particular memory device, such as that shown in FIG. 2(a) and those shown in FIG. 2(b). Any memory device in conjunction with which a compression test mode circuit according to the present invention can be implemented is amenable to the present invention. In one embodiment, the memory devices are dynamic random-access-memories (DRAMs). In other embodiments, the memory devices are static random-access-memories (SRAMs), flash memories, synchronous dynamic random-access-memories (SDRAMs), extended-data-out random-access-memories (EDO RAMs), and burst-extended-data-out random-access-memories (BEDO RAMs), as those skilled in the art will appreciate.

Figure 3:
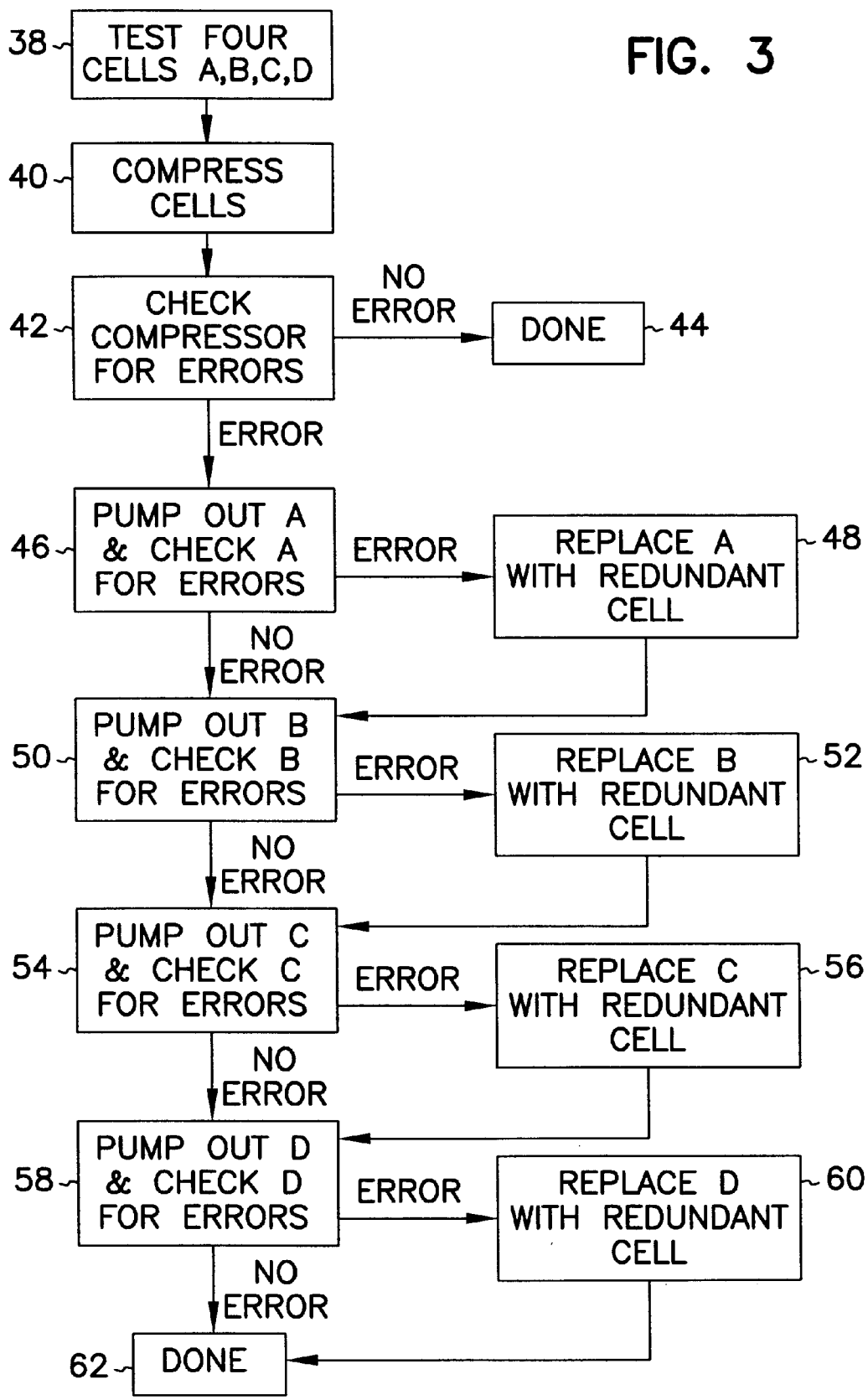
FIG. 3 is a method illustrating a data compression test mode, independent of redundancy, according to one embodiment of the present invention.

One embodiment of a data compression test mode independent of redundancy, according to the present invention, is shown in FIG. 3. As shown in FIG. 3, the data compression test mode tests four memory cells at a time. However, those skilled in the art will appreciate that the present invention is not so limited, and that any number of cells may be tested at one time. In step 38, the memory cells are tested, as has been discussed in conjunction with step 26 of FIG. 1. That is, a test bit of logic one or zero is written to each of the memory cells, and an output bit is then read from each of the cells. In step 40, the output bits of all four memory cells are compressed into a compressed bit, as has been discussed in conjunction with step 28 of FIG. 1.

In step 42, the compressed bit is checked for errors, as has been discussed in conjunction with step 30 of FIG. 3. For example, in one embodiment, if a test bit of logic zero is written to all the memory cells, an output bit of logic zero should thus be read from all the memory cells, which should thus yield a compressed bit of logic zero. However, if the output bit of logic one instead is read from at least one of the memory cells, indicating that one or more of the cells are defective, then the compressed bit will not yield a logic zero, and the error check of step 42 will fail. If the error check does not fail, the process ends at step 44.

If the error checking of step 42 does fail, however, control proceeds to step 46. In step 46, the output bit of the first of the four memory cells is pumped out individually. Step 46 also checks this output bit for an error. If there is an error—i.e., that the first memory cell is defective—then control proceeds to step 48, and a redundant cell replaces the first memory cell. In either case, control proceeds to step 50, which pumps out individually the output bit of the second of the four memory cells. Step 50 also checks this output bit for an error. If there is an error, then control proceeds to step 52, and a redundant cell replaces the second memory cell.

Again, in either case control proceeds to step 54, which pumps out individually the output bit of the third of the four memory cells. Step 54 also checks the output bit of the third memory cell for an error. If there is an error, then a redundant memory cell replaces the third memory cell in step 56. In either case, control proceeds to step 58, which pumps out individually the output bit of the fourth memory cell. Step 58 also checks the output bit of the fourth memory cell for an error. If there is an error, then a redundant memory cell replaces the fourth memory cell in step 60. In either case, the process ends at step 62.

As has been described in conjunction with FIG. 3, the compression test mode of the present invention is independent of redundancy. That is, upon an error being detected in the compressed bit in step 42, corresponding to the situation where at least one of the memory cells tested is defective, the test mode reverts from a compression mode to an individual bit mode, in which the output bits are pumped out for individual analysis. Thus, if all four memory cells are not defective, then no error is reported in step 42 and the process ends at step 44. However, if any of the cells is defective, then steps 46, 50, 54 and 58 determine which of the cells is actually defective, and replaces only those cells that are defective. Therefore, redundancy efficiency is increased, in that no nondefective cells are replaced by redundant cells.

Figure 4A:
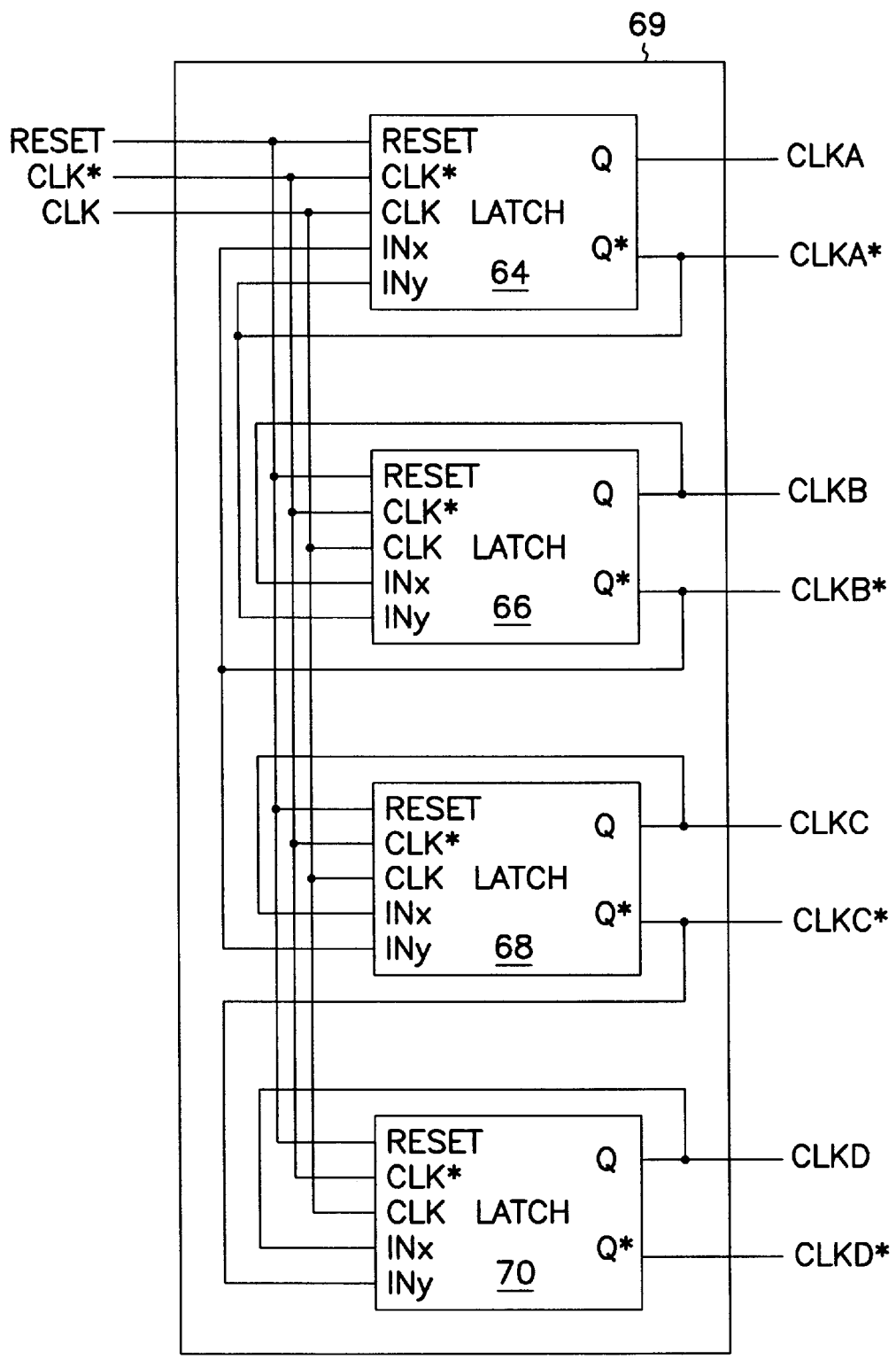
FIG. 4(a) is a block diagram of a control circuit component of a compression test mode circuit of a memory device, according to one embodiment of the present invention.

Referring now to FIG. 4(a), a block diagram of a control circuit according to one embodiment of the present invention is shown. Control circuit 69 is one component of a compression test mode circuit for a memory device, and comprises control circuits 64, 66, 68 and 70. Each of control circuits 64, 66, 68 and 70 as shown is a NOR latch, although the invention is not so particularly limited. Each of the latches has an input RESET, and an input CLK (along with its inverted counterpart CLK*). The latches output control lines, labeled as CLKA, CLKB, CLKC, and CLKD, for circuits 64, 66, 68 and 70, respectively (along with their inverted counterparts CLKA*, CLKB*, CLKC*, and CLKD*). Upon the assertion of the RESET input, each of CLKA, CLKB, CLKC, and CLKD is asserted. Furthermore, the inputs INX and INY of each of circuits 64, 66, 68 and 70 are operatively coupled together and with those of the other circuits as shown such that in successive clock cycles (i.e., successive assertions of the input CLK), control lines CLKA, CLKB, CLKC and CLKD are asserted individually. That is, in the first clock cycle after the assertion of the RESET input, only CLKA is asserted; in the second clock cycle, only CLKB is asserted; in the third, only CLKC; and in the fourth, only CLKD.

Figure 4B:
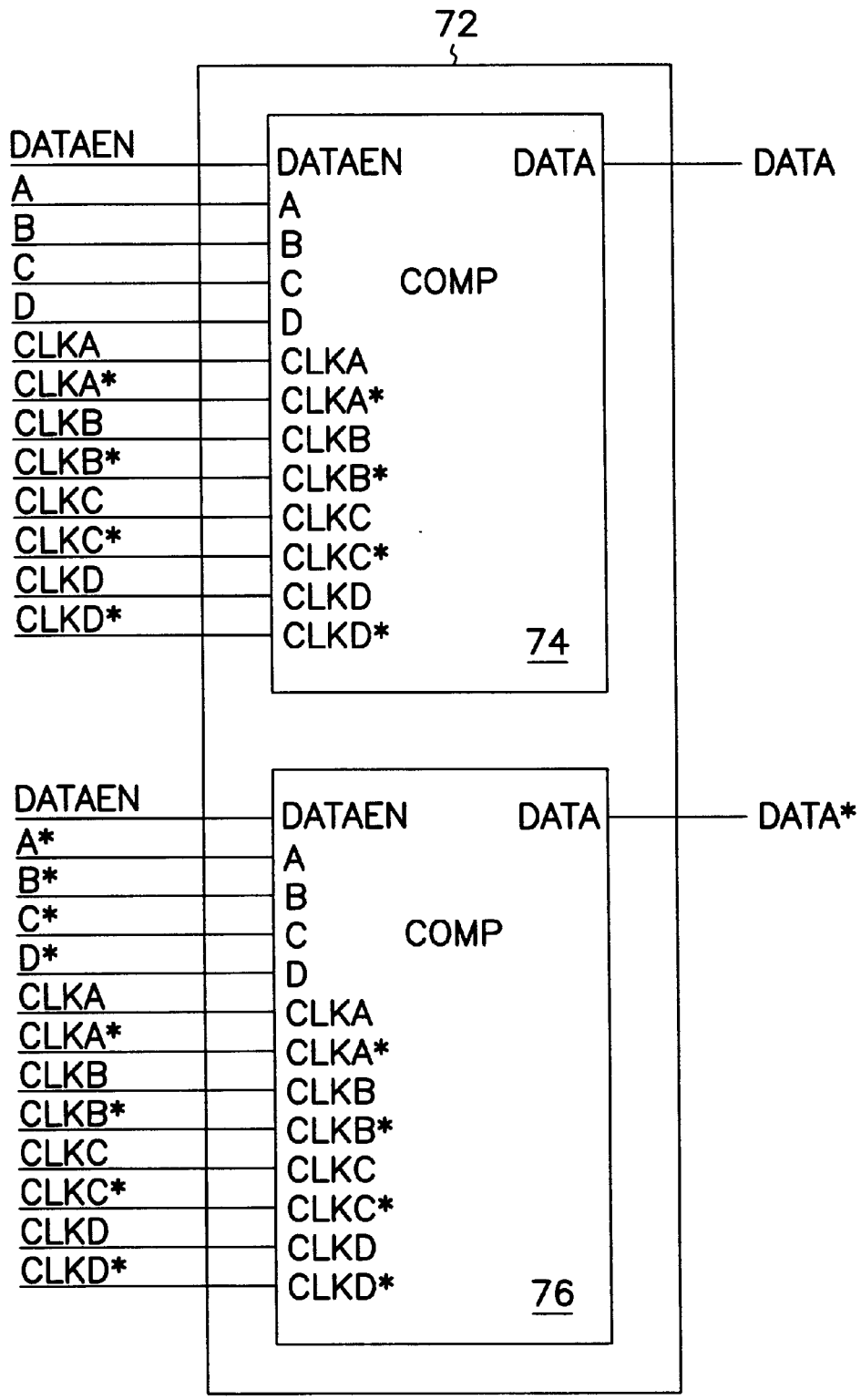
FIG. 4(b) is a block diagram of a compression circuit component of a compression test mode circuit of a memory device, according to one embodiment of the present invention.

Referring now to FIG. 4(b), a block diagram of a compression circuit according to one embodiment of the present invention is shown. Compression circuit 72 is another component of a compression test mode circuit for a memory device. Compression circuit 72 actually includes two circuits, circuit 74 and circuit 76, so that both a DATA output and an inverted DATA output (DATA*) are provided. The inputs to circuit 72 include the individual output bits of the four memory cells, labeled A, B, C and D, as well as the control lines CLKA, CLKB, CLKC and CLKD and their inverted counterparts (CLKA*, CLKB*, CLKC*, and CLKD*). Circuit 72 also includes the input DATAEN, which is a Data Enable. In response to the assertion of all of CLKA, CLKB, CLKC and CLKD inputs, the output DATA reflects a compression bit which is the compression of the output bits A, B, C and D. However, if only one of CLKA, CLKB, CLKC and CLKD is asserted, then circuit 72 passes through to output DATA the corresponding output bit A, B, C or D. For example, if only CLKC is asserted, then output DATA is the output bit C, etc.

Figure 5:
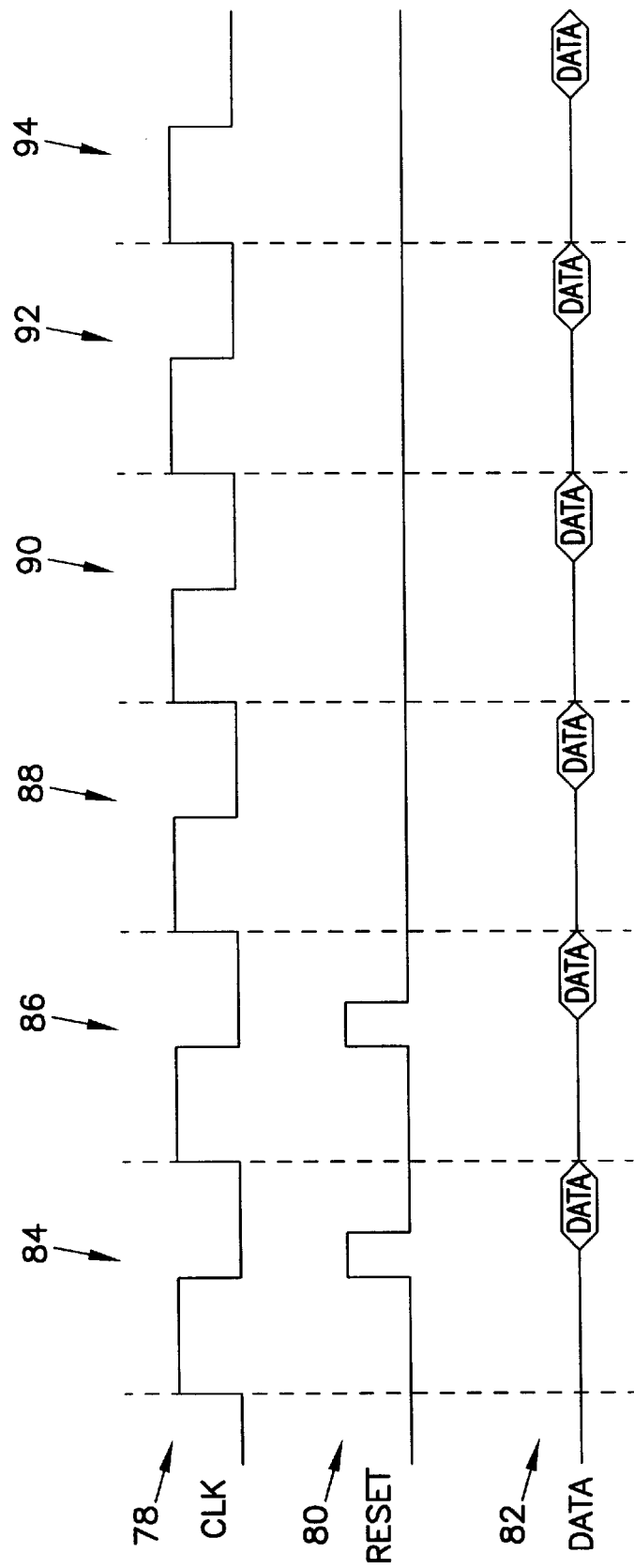
FIG. 5 is a timing diagram showing the operation of a compression test mode circuit of a memory device including the circuits of FIG. 4(a) and FIG. 4(b), according to one embodiment of the present invention.

An embodiment of the invention having a compression test mode circuit including circuit 69 of FIG. 4(a) and circuit 72 of FIG. 4(b) operates as is shown in the exemplary timing diagram of FIG. 5. The timing diagram includes CLK signal 78, RESET signal 80, and DATA signal 82, which correspond to their counterparts of FIG. 4(a) and FIG. 4(b). Clock cycles 84, 86, 88, 90, 92 and 94 are defined by the pulsing of CLK signal 78. During clock cycle 84, reset signal 80 is asserted, which causes DATA signal 82 to yield a compressed bit (i.e., the compression of output bits A, B, C and D). Because in this example the four memory cells tested during clock cycle 84 are free from defects, in the next clock cycle, clock cycle 86, reset signal 80 is again asserted, which causes DATA signal 82 to again yield a compressed bit (in which output bits A, B, C and D are again compressed, but which relate to different physical memory cells than in clock cycle 84).

However, because in this example at least one of the four memory cells tested during clock cycle 86 contains a defect, in the subsequent clock cycles, clock cycles 88, 90, 92 and 94, DATA signal 82 yields a particular output bit. In clock cycle 88, DATA signal 82 yields output bit A; in clock cycle 90, DATA signal 82 yields output bit B; in clock cycle 92, DATA signal 82 yields output bit C; and, in clock cycle 94, DATA signal 82 yields output bit D. In this manner, the output bits A, B, C and D are individually pumped out, such that the memory cells can be individually checked for errors. A memory cell is checked for errors and replaced if necessary in the same clock cycle as when its output bit is individually pumped out. Thus, if the memory cell having output bit C is defective, it is replaced with a redundant element during clock cycle 92.

Figure 6:
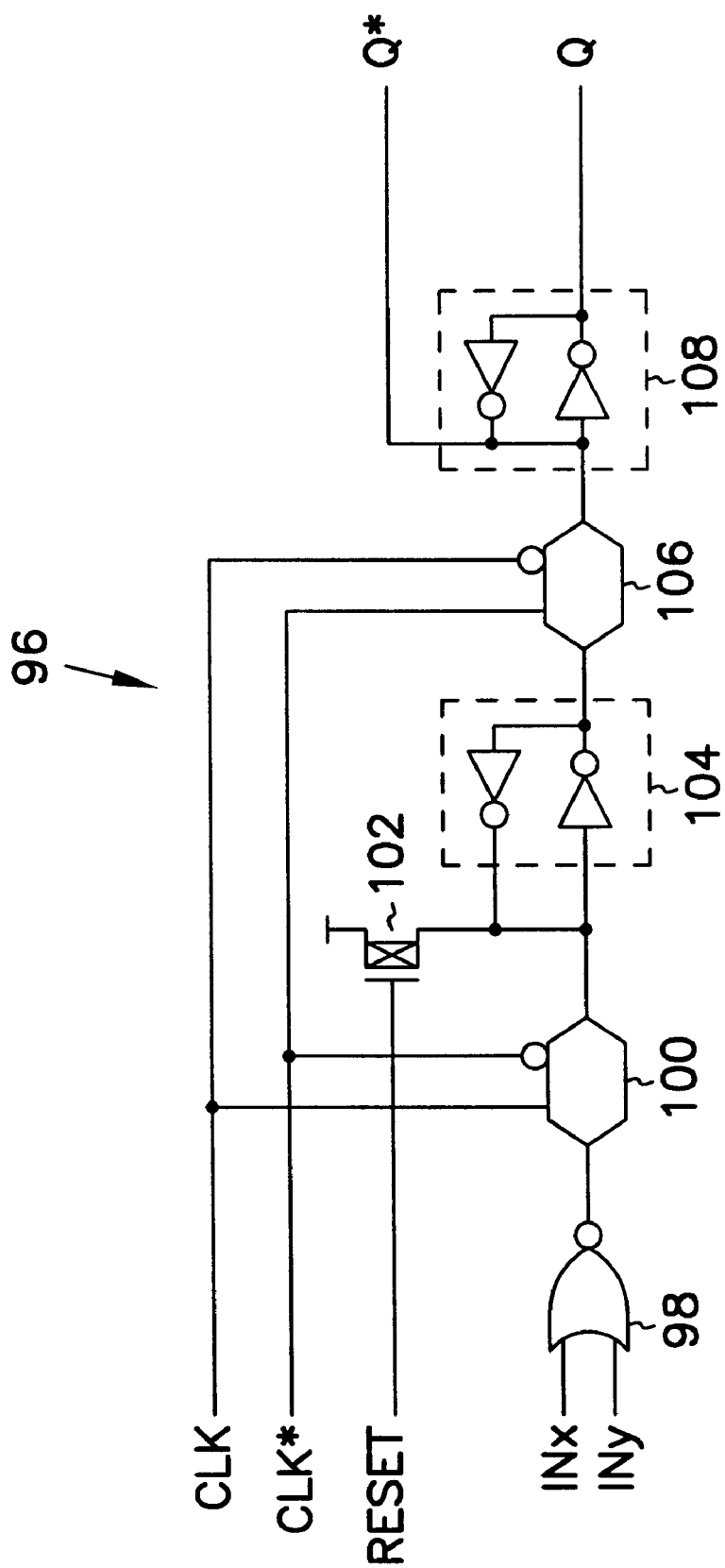
FIG. 6 is a schematic showing in more detail one embodiment of the control circuit of FIG. 4(a); and, FIG. 7 is a schematic showing in more detail one embodiment of the compression circuit of FIG. 4(b).

Referring now to FIG. 6, a schematic of one embodiment of the latches of FIG. 4(a) is shown. That is, latch 96 of FIG. 6 corresponds to each of latches 64, 66, 68 and 70 of FIG. 4(a). NOR gate 98 performs the NOR operation on inputs INX and INY, the output of which is then passed by pass gate 100 (which may be a multiplexer configured as a pass gate), as controlled by the CLK and CLK* inputs, to inverter stage 104. Inverter stage 104 inverts the result of the NOR operation of NOR gate 98 provided that the RESET input is low; if the RESET input is high, then transistor 102 pulls the input to inverter stage 104 high such that the output of inverter stage 104 is low. In any case, the output of inverter stage 104 is passed through pass gate 106 (such as a multiplexer configured as a pass gate), as again controlled by the CLK and CLK* inputs, to another inverter stage 108, which inverts the output of inverter stage 104. Thus, the output Q of latch 96 is the logical NOR function of the inputs INX and INY, unless the RESET input is high, in which case the output Q is also high (i.e., logic one).

Figure 7:
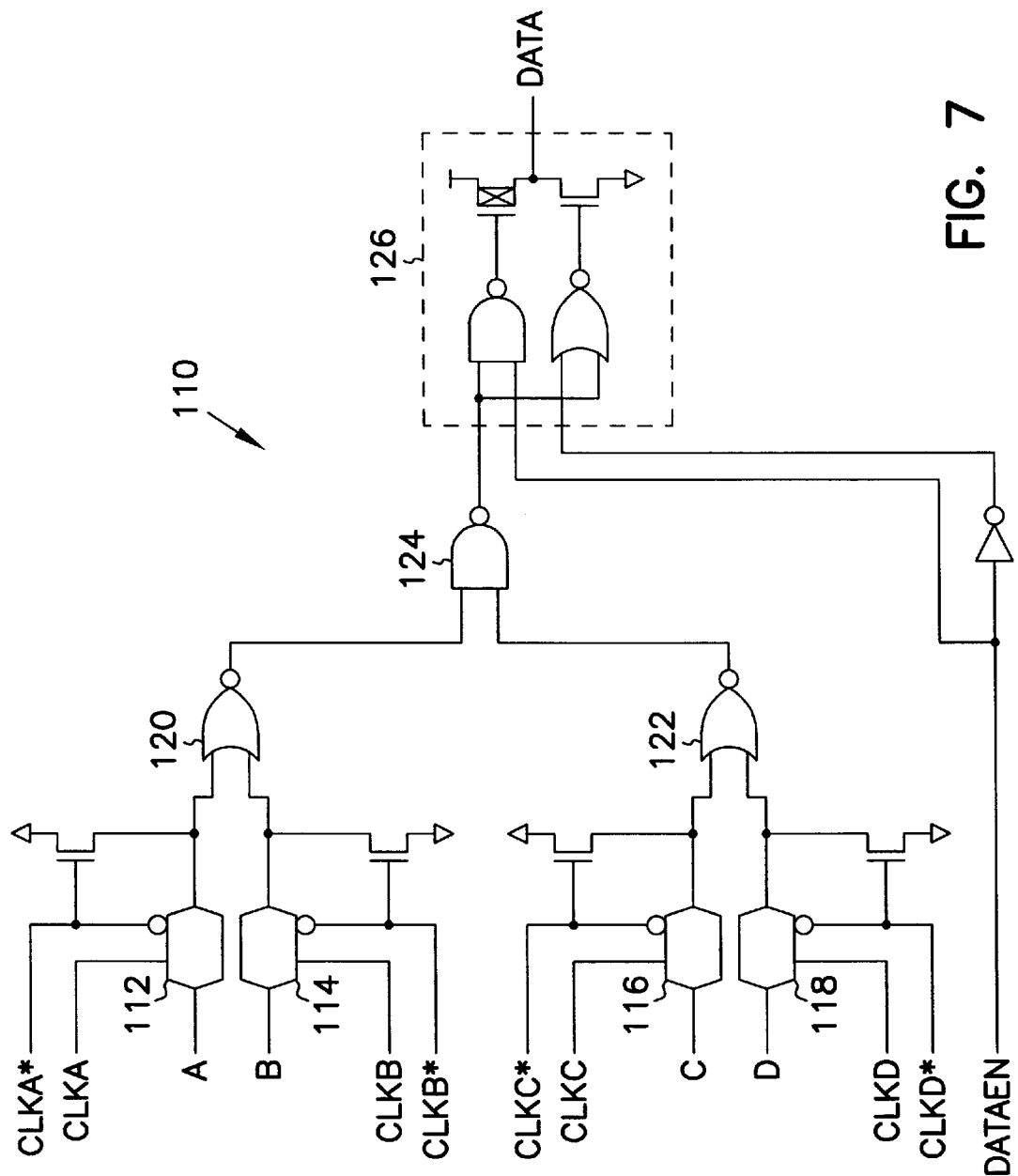

Referring now to FIG. 7, a schematic of one embodiment of circuits 74 and 76 of FIG. 4(b) is shown. That is, circuit 110 of FIG. 7 corresponds to each of circuits 74 and 76 of FIG. 4(b). Each of input stage circuits 112, 114, 116 and 118 is a pass gate, such as a multiplexer configured as a pass gate. Input stage circuits 112, 114, 116 and 118 pass their inputs (i.e, output bits A, B, C and D) provided that the corresponding control signal is asserted (i.e., CLKA, CLKB, CLKC and CLKD). If the control signal is not asserted, then a logic zero is passed instead. The input stage circuits are operatively coupled to NOR gates 120 and 122 as shown, the outputs of which are themselves operatively coupled to NAND gate 124 as shown. Finally, the output of NAND gate 124 is operatively coupled to output stage 126, which is enabled by the data enable input DATAEN as shown.

Thus, as shown in FIG. 7, if all the control signals are asserted, the output DATA returns the compressed bit according to the function DATA=NOT(NOT(A+B)*NOT (C+D)). Circuit 110 therefore allows for error-checking of memory cells wherein each memory cell is written with a test bit of logic zero. If each of the memory cells is not defective, the output bits A, B, C and D will yield a compression bit of NOT (NOT (0+0)*NOT(0+0))=0, which is equal to the test bit. If any of the memory cells is defective and otherwise returns an output bit of logic one, the compression bit will also return a logic one, since the expression NOT (NOT(A+B)*NOT(C+D) always returns a logic one in the case where at least one of A, B, C or D is logic one. When only one of the control signals is asserted, the output DATA returns just the output bit corresponding to that control signal, according to the function DATA=NOT (NOT(X+0) *NOT(0+0))=X, where X is the output bit corresponding to that control signal. In other words, the output DATA passes the output bit corresponding to a particular control signal when only that control signal is asserted.

Therefore, circuit 110 of FIG. 7 provides for error-checking of the memory cells of a memory device in which a test bit of logic zero is first written to four memory cells at a time, and then an output bit is read from each of the four memory cells. The output bits serve as inputs to circuit 110 of FIG. 7. In a first clock cycle where all of the control signals are asserted, circuit 110 returns a compression bit equal to the compression of the four output bits. If this compression bit is found to be in error, then in successive clock cycles each of the control signals is asserted in turn, so that circuit 110 passes through the output bit of each of the four memory cells in turn. This permits for individual error-checking of the memory cells, so that only those cells that are defective can be replaced by redundant cells.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the following claims and equivalents thereof.

I claim:

1. A method for testing a memory array of a memory device, comprising the steps of:

testing a predetermined number of cells of the memory array, resulting in each cell having an output bit;

compressing the output bits into a compressed bit;

error-checking the compressed bit; and, outputting each output bit individually upon failure of the compressed bit.

2. The method of claim 1, wherein the step of testing a predetermined number of cells of the memory array comprises the steps of:

writing a test bit to each of the predetermined number of cells of the memory array; and, reading the output bit from each of the predetermined number of cells of the memory array.

3. The method of claim 1, further comprising the steps of:

error-checking each output bit; and, replacing a cell of the memory array with a redundant cell upon failure of the output bit of the cell.

4. The method of claim 1, wherein each output bit has a corresponding control line, and the step of outputting each output bit individually upon failure of the compressed bit comprises the step of individually asserting successive control lines.

5. A memory device comprising:

a memory array having a plurality of cells and a plurality of redundant cells;

a compression test mode circuit operatively coupled to the memory array to replace with redundant cells only the cells that are defective; and, wherein each cell has an output bit, the compression test mode circuit in a first clock cycle compressing the output bits of a predetermined number of cells and in successive clock cycles outputting individually the output bits of successive cells.

6. The memory device of claim 5, wherein the memory device is selected from the group of memory devices consisting of: a dynamic random-access memory (DRAM), a static random-access memory (SRAM), a flash memory, a synchronous dynamic random-access memory (SDRAM), an extended data out random-access memory (EDO RAM), and a burst extended data out random-access memory (BEDO RAM).

7. The memory device of claim 5 wherein the compression test mode circuit comprises:

a control circuit comprising a plurality of NOR latch circuits, a reset input, one or more clock inputs, and a plurality of output control lines; and a compression circuit comprising a plurality of logic circuits, each logic circuit having a plurality of first inputs coupled respectively to receive output bits from the cells, a plurality of second inputs coupled respectively to the output control lines, and a data output, each logic circuit being structured to generate a single signal at the data output by compressing the output bits when all of the output control lines are asserted and by reproducing a selected one of the output bits when a single corresponding output control line is asserted.

8. A memory device comprising:

a memory array having a plurality of cells and a plurality of redundant cells;

a compression test mode circuit operatively coupled to the memory array to replace with redundant cells only the cells that are defective; and, wherein each cell has an output bit, and the compression test mode circuit comprises:

a control circuit having a plurality of control lines; and, a compression circuit to compress the output bits of a predetermined number of cells upon assertion of all the control lines.

9. The memory device of claim 8, wherein the compression circuit further outputs individually the output bit of a cell corresponding to a particular control line upon assertion of only the particular control line.

10. The memory device of claim 8, wherein the control circuit asserts all the control lines in response to assertion of a first input, and individually asserts successive control lines in response succesive assertions of a second input.

11. The memory device of claim 8, wherein the memory device is selected from the group of memory devices consisting of: a dynamic random-access memory (DRAM), a static random-access memory (SRAM), a flash memory, a synchronous dynamic random-access memory (SDRAM), an extended data out random-access memory (EDO RAM), and a burst extended data out random-access memory (BEDO RAM).

12. The memory device of claim 8 wherein:

the control circuit comprises a plurality of NOR latch circuits, a reset input, one or more clock inputs, and the control lines; and wherein the compression circuit comprises a plurality of logic circuits, each logic circuit having a plurality of first inputs coupled respectively to receive output bits from the cells, a plurality of second inputs coupled respectively to the control lines, and a data output, each logic circuit being structured to generate a single signal at the data output by compressing the output bits when all of the control lines are asserted and by reproducing a selected one of the output bits when a single corresponding control line is asserted.

13. A compression test mode circuit for a memory device having an array of cells, each cell having an output bit, the circuit comprising:

a plurality of control circuits, each control circuit having a control line; and, a compression circuit to compress the output bits of a predetermined number of cells upon assertion of all the control lines, and to output individually the output bit of a cell corresponding to a particular control line upon assertion of only the particular control line.

14. The compression test mode circuit of claim 13, wherein each control circuit comprises a latching circuit.

15. The compression test mode circuit of claim 13, wherein the control line of each control circuit is asserted upon assertion of a first input to all the control circuits.

16. The compression test mode circuit of claim 13, wherein the control circuits are operatively coupled to one another such that successive control lines are individually asserted upon successive assertions of a second input to all the control circuits.

17. The compression test mode circuit of claim 13 wherein:

the control circuits comprise a plurality of NOR latch circuits, a reset input, one or more clock inputs, and the control lines; and wherein the compression circuit comprises a plurality of logic circuits, each logic circuit having a plurality of first inputs coupled respectively to receive the output bits of the predetermined number of cells, a plurality of second inputs coupled respectively to the control lines, and a data output, each logic circuit being structured to generate a single signal at the data output by compressing the output bits of the predetermined number of cells when all of the control lines are asserted and by reproducing a selected one of the output bits when a single corresponding control line is asserted.

18. A compression test mode circuit for a memory device having an array of cells, each cell having an output bit, the circuit comprising:

a plurality of control circuits, each control circuit having a control line;

a plurality of input stage circuits, each input stage circuit passing an output bit of a cell upon assertion of a particular control line; and, a compression circuit compressing the output bits passed by the input stage circuits, but just passing an output bit if the input stage circuits passed only the output bit.

19. The compression test mode circuit of claim 18, wherein each input stage circuit comprises a multiplexer configured as a pass gate.

20. The compression test mode circuit of claim 18, further comprising an output stage circuit operatively coupled to the compression circuit.

21. The compression test mode circuit of claim 18 wherein:

the control circuits comprise a plurality of NOR latch circuits, a reset input, one or more clock inputs, and the control lines; and wherein the input stage circuits and the compression circuit comprise a plurality of logic circuits, each logic circuit having a plurality of first inputs coupled respectively to receive the output bits, a plurality of second inputs coupled respectively to the control lines, and a data output, each logic circuit being structured to generate a single signal at the data output by compressing the output bits when all of the control lines are asserted and by reproducing a selected one of the output bits when a single corresponding control line is asserted.

* * * * *